United States Patent [19]

Szeto

[11] Patent Number: 4,775,644

[45] Date of Patent: Oct. 4, 1988

[54] ZERO BIRD-BEAK OXIDE ISOLATION SCHEME FOR INTEGRATED CIRCUITS

[75] Inventor: Roger T. Szeto, San Jose, Calif.

[73] Assignee: LSI Logic Corporation, Milpitas, Calif.

[21] Appl. No.: 57,458

[22] Filed: Jun. 3, 1987

[51] Int. Cl.⁴ .................. H01L 21/467; H01L 21/473
[52] U.S. Cl. ........................................ 437/69; 437/73
[58] Field of Search ................................... 437/69, 73

[56] References Cited

U.S. PATENT DOCUMENTS

| | | | |
|---|---|---|---|
| 3,648,125 | 3/1972 | Peltzer | 437/63 |
| 3,961,999 | 6/1976 | Antipov | 437/73 |
| 4,118,728 | 10/1978 | Berry | 357/22 |
| 4,271,583 | 6/1981 | Kahng et al. | 437/228 X |
| 4,272,308 | 6/1981 | Varshney | 437/73 X |
| 4,292,156 | 9/1981 | Matsumoto et al. | 437/73 X |
| 4,533,429 | 8/1985 | Josquin | 437/69 X |
| 4,561,172 | 12/1985 | Slawinski et al. | 437/69 X |
| 4,622,096 | 11/1986 | Dil et al. | 437/69 X |

Primary Examiner—George T. Ozaki
Attorney, Agent, or Firm—Alan H. MacPherson; Paul J. Winters; Norman R. Klivans

[57] ABSTRACT

The present method provides for formation of isolation oxide without "bird-beak" extensions thereof through the use of a nitride mask in contact with the surface of a semiconductor substrate on both sides of a patterned oxide layer, on which substrate the isolation oxide is grown.

5 Claims, 1 Drawing Sheet

ZERO BIRD-BEAK OXIDE ISOLATION SCHEME FOR INTEGRATED CIRCUITS

BACKGROUND OF THE INVENTION

1. Field of the Invention

This invention relates to the forming of isolation or field oxide in a semiconductor device, (namely, an integrated circuit,) and more particularly, to a method of forming such oxide which eliminates the "bird-beak" extension of the oxide commonly formed as a part of the isolation oxide. This invention also relates to the resulting structure.

2. Prior Art

In U.S. Pat. No. 3,648,125 entitled "Method of Fabricating Integrated Circuits with Oxidized Isolation and The Resulting Structure", on an invention of Douglas L. Peltzer, the importance of electrically isolating a plurality of pockets of semiconductor material through the use of field or isolation oxide is disclosed. The advantages of such oxide isolation are set forth in that patent, and the use thereof has become widespread.

As is well known, it is highly desirable to keep the isolation oxide area as small as possible so that the number of devices which can be placed on a wafer is maximized. Meanwhile of course, the isolation function cannot be compromised.

In a known example of oxide isolation growth, reference is made to U.S. Pat. No. 4,118,728, entitled "Integrated Circuit Structures Utilizing Conductive Buried Regions" invented by Robert Berry. With reference to FIGS. 2 and 3 thereof in particular, oxide and nitride layers are patterned on an epitaxial layer of a semiconductor structure. The oxide layer is generally required to reduce the generation of defects during the isolation formation process. Because of the exposed edges of this oxide layer, when field oxide is subsequently grown, the field oxide takes the shape shown in FIG. 3, defining the bird-beak regions which in fact lift the nitride layer edges. These bird-beak formations reduce to an extent the packing density of devices which can be achieved by encroaching into active regions of the device. That is, if such bird-beak regions could be eliminated, the oxide isolation regions could be moved closer together without sacrificing size of the active device region therebetween. This would result in the ability to position active device regions more closely together, without sacrifice of oxide isolation effectiveness and thus increase device packing density.

SUMMARY

It is accordingly an object of this invention to provide a method of forming isolation oxide in a semiconductor device which overcomes the above-cited problems, by eliminating the encroaching bird-beak extension of such oxide isolation region normally formed during the formation of the region.

Broadly stated, in accordance with the invention a method of forming isolation oxide in a semiconductor device is provided. More specifically, this method includes providing a layer of semiconductor material having a surface, providing an oxide layer over a portion of the surface of the layer of semiconductor material, providing a first nitride layer over a portion of the oxide layer, patterning the first nitride layer to expose a portion of the oxide layer, patterning the oxide layer using the patterned first nitride layer as a mask, providing a second nitride layer over at least a portion of the resulting structure, in contact with the patterned first nitride layer and the surface of the layer of semiconductor material, patterning the second nitride layer to leave an exposed portion of the surface of the layer of semiconductor material, spaced from the oxide layer by nitride material, and growing an isolation oxide in the exposed portion of the layer of semiconductor material.

Further in accordance with the invention, a semiconductor device is made up of a layer of semiconductor material, an oxide layer over a portion of the layer of semiconductor material, nitride material in contact with the layer of semiconductor material adjacent one edge of the oxide layer, and an isolation oxide on the layer of semiconductor material and spaced from the edge of the oxide layer by the nitride material.

Containment of the oxide layer by the nitride layers and layer of semiconductor material during the growth of the isolation oxide ensures that bird-beak extension of the isolation oxide is eliminated, by ensuring that the field oxide grows without further growth or thickening of the already existing oxide layer, as is the case in the prior art.

BRIEF DESCRIPTION OF THE DRAWINGS

Other objects of the invention will become apparent from a study of the following specification and drawings in which.

DESCRIPTION OF THE PREFERRED EMBODIMENT

Figure 1:
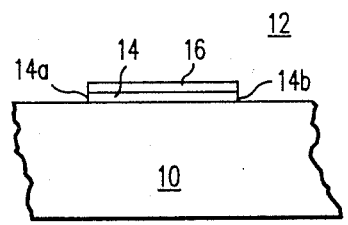
FIGS. 1 and 2 show the method of forming oxide isolation in accordance with the prior art.
Figure 2:
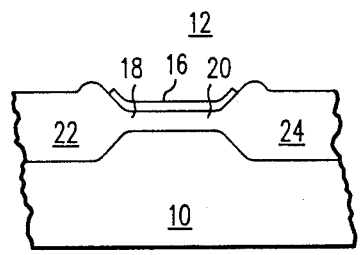
Figure 3:
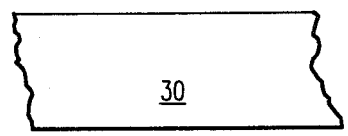
FIGS. 3–10 illustrate the method in sequential steps of the present invention.
Figure 4:
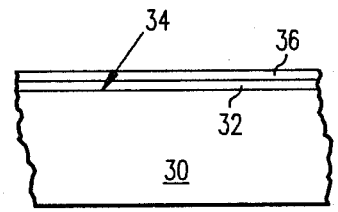
Figure 5:
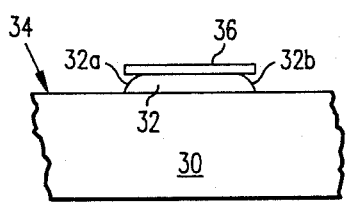
Figure 6:
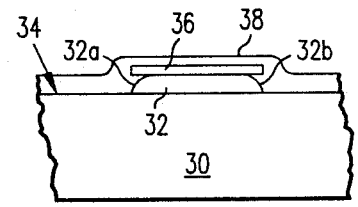

Shown in FIG. 1 is an epitaxial layer 10 of a semiconductor device 12, having patterned thereon an oxide layer 14, which has in turn patterned thereon a nitride layer 16. In the subsequent oxidizing technique to grow field oxide, because of the exposure of the edges 14a, 14b of the oxide layer 14, further oxidation of that area underneath the ends of the nitride layer 16 takes place, resulting in formation of the bird-beak extensions 18, 20 of the field oxide regions 22, 24. This is shown in FIGS. 2 and 3 of U.S. Pat. No. 4,118,728 to Berry, and results in the problems described above.

In order to overcome this, and achieve other benefits as set forth below, the present method and device are hereinbelow described and shown in FIGS. 3–10.

Referring to FIG. 3, a layer of semiconductor material 30, for example, of P conductivity, is shown. This layer 30 may be a conventional semiconductor substrate or an epitaxial layer as appropriate.

An oxidation step is then undertaken, wherein an oxide layer 32 (FIG. 4) is grown on the surface 34 of the layer of semiconductor material 30. Subsequent to the growth of such oxide layer 32, nitride layer 36 is formed over the oxide layer 32, by an LPCVD nitride deposition or other suitable method.

An appropriate masking step is undertaken along with a subsequent anisotropic plasma etch to pattern the nitride layer 36 to expose portions of the oxide layer 32. An HF etch step is then undertaken to etch the oxide 32 into the pattern shown in FIG. 5, using the patterned nitride layer 36 as a mask. This etching exposes portions of the surface 34 of the semiconductor surface. The etching in effect forms an undercut of the oxide so that the patterned nitride layer 36 extends beyond the edges 32a, 32b of the patterned oxide layer 32.

Subsequently, a second nitride layer 38 is deposited over the resulting structure. The nitride layer 38 is again preferably deposited by LPCVD, but any method can be used which insures free flow of the nitride onto all the surfaces as shown. That is, the nitride layer 38 is in contact with the patterned first nitride layer 36 and the surface 34 of the semiconductor material 30 and also in contact with the edges 32a, 32b of the oxide layer 32.

Figure 7:
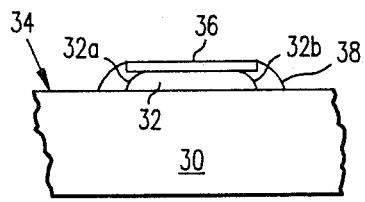

A plasma anisotropic etch is undertaken, removing portions of the second nitride layer 38 to provide the structure shown in FIG. 7. This results in the oxide layer 32, as shown in cross-section, being contained within nitride material (made up of portions of original first nitride layer 36 and second nitride layer 38), and the semiconductor material 30 itself. That is, the edges 32a, 32b of the oxide layer 32, which were previously exposed to the oxidation process as set forth in prior art FIGS. 1 and 2, are now completely contained by the patterned first and second nitride layers 36, 38 and the layer of semiconductor material 30 itself. In fact, those edges 32a, 32b of the oxide layer 32 are spaced laterally from the exposed surfaces of the layer of semiconductor material 30 which will undergo field oxidation, with nitride material of the patterned second nitride layer 38 providing spacing and separation of the edges of the oxide layer 32 from exposed surfaces of the layer of semiconductor material which will undergo field oxidation.

Figure 8:
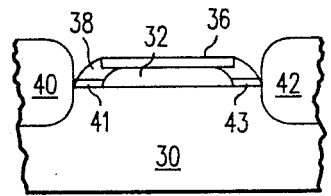

The growth of field oxide 40, 42 is shown in FIG. 8. During the growth of field oxide 40, 42, thin layers of oxide 41, 43 will grow on the surface of semiconductor material 30 under the remaining portions of the patterned nitride layer 38. However, because of the spacing described above in particular provided by the patterned second nitride layer 38, the encroaching bird-beak described in the prior art will not form.

Figure 9:
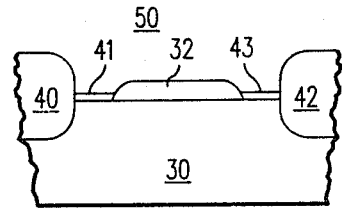
Figure 10:
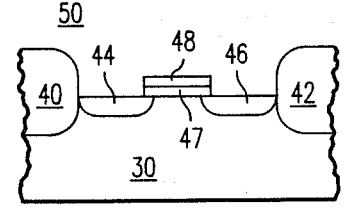

After the field oxide formation is completed the silicon nitride is removed by standard techniques and further processing undertaken to complete the device. The device can be completed as is well known to provide gate oxide 47, gate 48, source 44 and drain 46 regions of an MOS transistor 50 (FIGS. 9 and 10).

Because of the elimination of the bird-beak extension of the field oxide, a higher packing density of devices can be achieved on a wafer, without sacrificing effectiveness of oxide isolation. Typically, for current 1½ micron technology, the packing density can be expected to be approximately 15% higher than in those systems including the bird-beak extension.

I claim:

1. A method of forming isolation oxide in a semiconductor device comprising:
    providing a layer of semiconductor material having a surface;
    providing an oxide layer over a portion of the surface of the layer of semiconductor material;
    providing a first nitride layer over a portion of the oxide layer;
    patterning the first nitride layer to expose a portion of the oxide layer;
    patterning the oxide layer to undercut the first nitride layer, using the patterned first nitride layer as a mask;
    providing a second nitride layer over at least a portion of the resulting structure, in contact with the patterned first nitride layer and the surface of the layer of semiconductor material;
    patterning the second nitride layer to leave an exposed portion of the surface of the layer of semiconductor material, spaced from the oxide layer by nitride material; and
    growing an isolation oxide in the exposed portion of the layer of semiconductor material.

2. The method of claim 1 wherein the second nitride layer is provided in contact with the oxide layer.

3. The method of claim 1 wherein the exposed surface portion of the layer of semiconductor material is spaced from the oxide layer by nitride material of the patterned second nitride layer.

4. The method of claim 3 and further comprising the step of removing, subsequent to growing said isolation oxide, the remainder of the first nitride layer.

5. The method of claim 4 wherein the first and second nitride layers are deposited.

* * * * *